United States Patent
Ye et al.

(10) Patent No.: US 9,564,881 B2
(45) Date of Patent: Feb. 7, 2017

(54) AREA-EFFICIENT METAL-PROGRAMMABLE PULSE LATCH DESIGN

(71) Applicant: QUALCOMM Incorporated, San Diego, CA (US)

(72) Inventors: Qi Ye, San Diego, CA (US); Steven James Dillen, San Diego, CA (US); Animesh Datta, San Diego, CA (US); Zhengyu Duan, San Diego, CA (US); Satyanarayana Sahu, San Diego, CA (US); Praveen Narendranath, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/720,634

(22) Filed: May 22, 2015

(65) Prior Publication Data
US 2016/0344374 A1 Nov. 24, 2016

(51) Int. Cl.
*H03K 3/012* (2006.01)
*H03K 3/037* (2006.01)
(Continued)

(52) U.S. Cl.
CPC ............ *H03K 3/0375* (2013.01); *H03K 3/012* (2013.01); *H03K 3/037* (2013.01); *H03K 5/131* (2013.01)

(58) Field of Classification Search
CPC .................... G09G 2310/0286; G09G 3/3677; G11C 19/28; G11C 7/222; H01L 2224/48091; H01L 2224/48247; H01L 2224/73265; H01L 2924/00; H01L 2924/00014; H01L 2924/0002; H01L 2924/1305; H01L 2924/13055; H01L 2924/13091; H03K 17/168; H03K 19/00361; H03K 19/018521; H03K 19/018528; H03K 2217/0063; H03K 2217/0081; H03K 3/00; H03K 3/012; H03K 3/0375
(Continued)

(56) References Cited

U.S. PATENT DOCUMENTS 4,659,316 A 4/1987 Ozaki
4,768,167 A 8/1988 Yoder
(Continued)

FOREIGN PATENT DOCUMENTS

EP 0401865 A2 12/1990
EP 0459696 A2 12/1991
(Continued)

OTHER PUBLICATIONS

Partial International Search Report—PCT/US2016/025180—ISA/EPO—Jul. 25, 2016.
(Continued)

*Primary Examiner* — Lincoln Donovan
*Assistant Examiner* — David Mattison
(74) *Attorney, Agent, or Firm* — Arent Fox LLP

(57) ABSTRACT

A pulse generator includes a latch module for storing first/second states, a pulse clock module for generating a clock pulse, and a delay module for delaying the clock pulse at a second latch-module input. The latch module has a first latch-module input coupled to a clock, the second latch-module input, and a latch-module output. The pulse clock module has a first pulse-clock-module input coupled to the clock, a second pulse-clock-module input coupled to the latch-module output, and a pulse-clock-module output. The delay module is coupled between the latch-module output and second pulse-clock-module input or between the pulse-clock-module output and second latch-module input. The
(Continued)

delay module provides functionally $\overline{I_1 I_A}$ at a delay module output, where $I_1$ is a function of I and $I_A$ is a function of $I_{N0}$ and $B_0$, and where I is a delay module input, $B_0$ is a first input bit, and $I_{N0}$ is a first net input.

28 Claims, 4 Drawing Sheets

(51) Int. Cl.
  *H03K 5/131* (2014.01)
  *H03K 5/13* (2014.01)
(58) Field of Classification Search
  USPC .......................................................... 327/217
  See application file for complete search history.

(56) References Cited

U.S. PATENT DOCUMENTS

| | | | |
|---|---|---|---|
| 5,072,132 A | 12/1991 | Samaras et al. | |
| 5,173,870 A | 12/1992 | Sukashita et al. | |
| 5,557,225 A * | 9/1996 | Denham | H03K 3/037 |
| | | | 327/172 |
| 5,764,089 A | 6/1998 | Partovi et al. | |
| 5,825,225 A | 10/1998 | Sugisawa et al. | |
| 5,883,529 A | 3/1999 | Kumata et al. | |
| 5,886,529 A | 3/1999 | Wakamatsu | |
| 6,597,223 B2 | 7/2003 | Vangal et al. | |
| 6,701,339 B2 | 3/2004 | Vangal et al. | |
| 6,879,201 B1 | 4/2005 | Chan | |
| 6,937,079 B1 | 8/2005 | Zhao et al. | |
| 7,042,267 B1 | 5/2006 | Pasqualini | |
| 7,046,066 B2 | 5/2006 | Saado et al. | |
| 7,180,350 B2 | 2/2007 | Hsieh et al. | |
| 7,180,351 B2 | 2/2007 | Hsieh et al. | |
| 7,256,621 B2 | 8/2007 | Lih et al. | |
| 7,492,203 B2 | 2/2009 | Kim | |
| 7,525,361 B2 | 4/2009 | Kim | |
| 7,667,500 B1 | 2/2010 | Alfke | |
| 7,724,058 B2 | 5/2010 | Saint-Laurent et al. | |
| 8,013,654 B1 | 9/2011 | Chen et al. | |
| 8,222,921 B2 | 7/2012 | Lewis et al. | |
| 8,253,463 B1 | 8/2012 | Chromczak et al. | |
| 8,427,213 B2 | 4/2013 | Lewis et al. | |
| 2001/0008488 A1* | 7/2001 | Shinozaki | G11C 7/22 |
| | | | 365/63 |
| 2006/0139084 A1 | 6/2006 | Kim et al. | |
| 2006/0181322 A1 | 8/2006 | Kim et al. | |
| 2007/0075738 A1 | 4/2007 | Hamada et al. | |
| 2007/0236253 A1 | 10/2007 | Tachibana et al. | |
| 2009/0058463 A1 | 3/2009 | Saint-Laurent et al. | |
| 2009/0154267 A1 | 6/2009 | Kang | |
| 2013/0328601 A1 | 12/2013 | Geisler et al. | |

FOREIGN PATENT DOCUMENTS

| | | |
|---|---|---|
| JP | 62188515 | 8/1987 |
| JP | 2235434 A | 9/1990 |
| JP | H03272216 A | 12/1991 |
| JP | 9205360 A | 8/1997 |
| JP | H09232919 A | 9/1997 |
| JP | 10190416 A | 7/1998 |
| JP | 10276069 | 10/1998 |
| JP | 10512112 | 11/1998 |
| JP | 2003133916 | 5/2003 |
| JP | 2003173361 A | 6/2003 |
| JP | 2007053680 A | 3/2007 |
| JP | 2007281756 A | 10/2007 |
| WO | 9621272 | 7/1996 |
| WO | 9621272 A1 | 7/1996 |

OTHER PUBLICATIONS

International Search Report and Written Opinion—PCT/US2016/025180—ISA/EPO—Sep. 22, 2016.

* cited by examiner

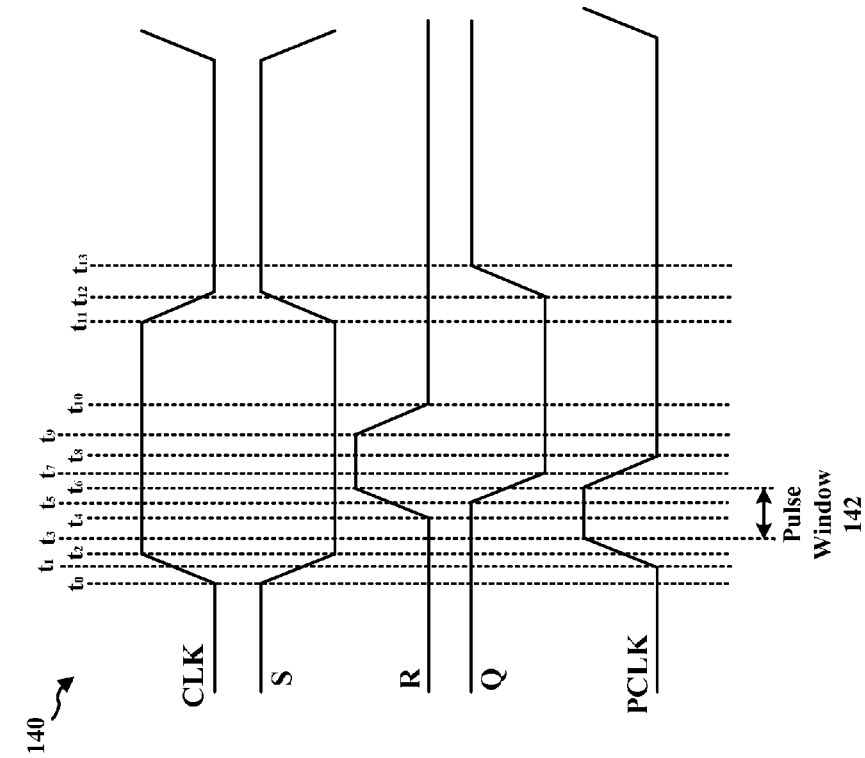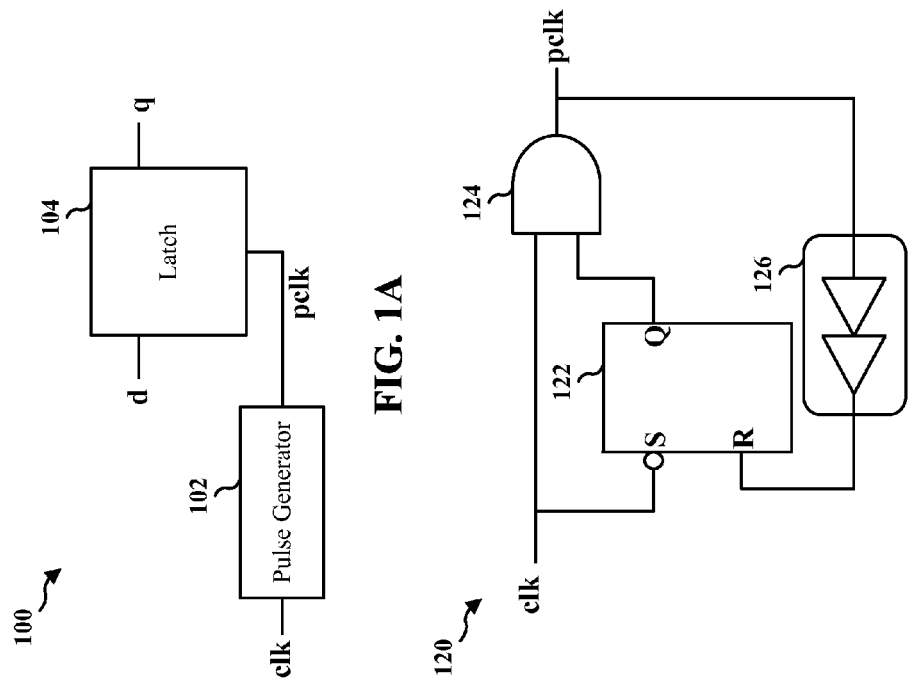

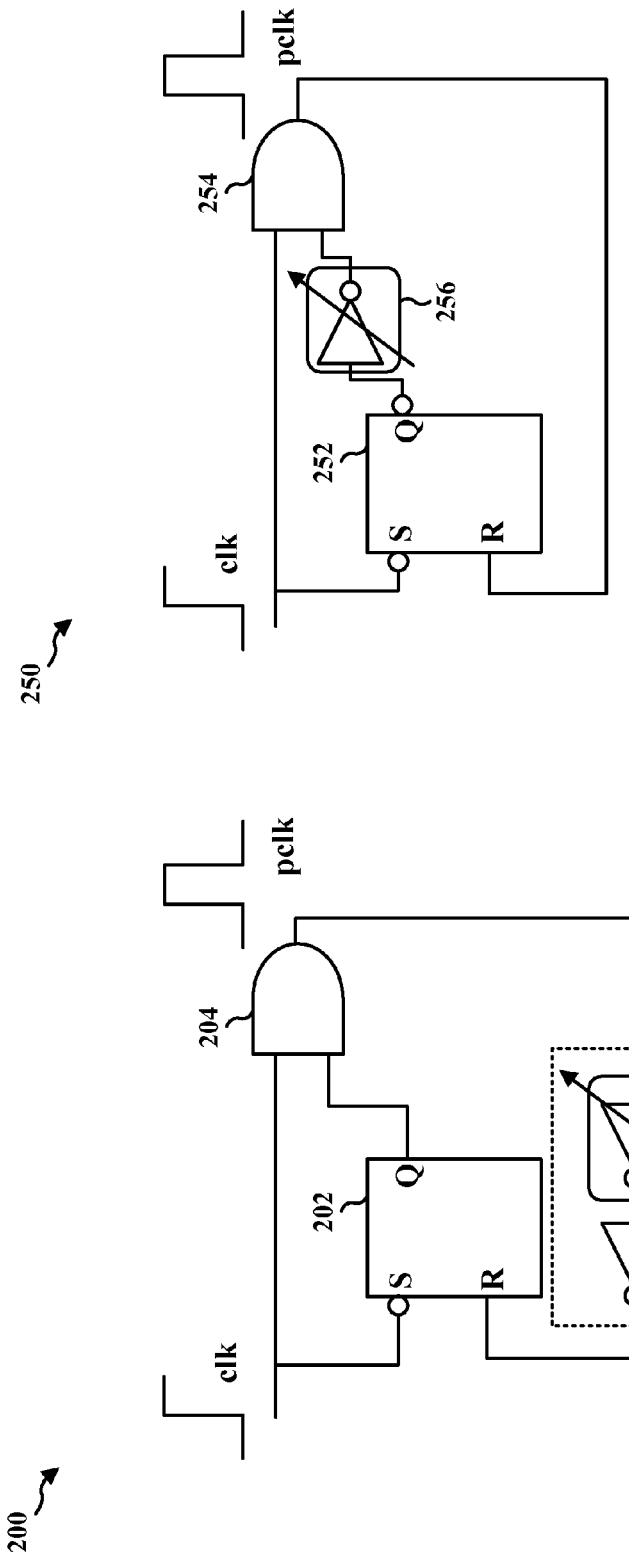

AREA-EFFICIENT METAL-PROGRAMMABLE PULSE LATCH DESIGN

BACKGROUND

Field

The present disclosure relates generally to a pulse latch design, and more particularly, to a pulse generator for a pulse latch.

Background

A pulse latch includes a latch and a pulse generator (also referred to as a pulser) for driving the latch. A pulse latch implements flip-flop functionality. A pulse latch may provide substantial advantages in performance and power savings over regular flip-flops. A pulse window generated by the pulse generator should be wide enough to provide a good write-margin for reliably writing into the latch. However, if the pulse window is too wide, the latch will need to have a large hold time. A large hold time of the latch requires additional hold logic within the latch, resulting in a latch that requires more area and consumes more power. Pulse latches should also have a sufficient hold-margin. The hold-margin is the minimum hold time of the pulse latch minus the requisite hold time (due to the width of the pulse window) of the pulse latch. If the hold-margin is insufficient, hold violations may occur in the pulse latch. There is currently a need for a pulse latch that has a good hold-margin and a good write-margin.

SUMMARY

In an aspect of the disclosure, a pulse generator includes a latch module, a pulse clock module, and a delay module. The latch module is configured to store a first state or a second state. The latch module has a first latch-module input, a second latch-module input, and a latch-module output. The first latch-module input is coupled to a clock. The pulse clock module is configured to generate a clock pulse. The pulse clock module has a first pulse-clock-module input, a second pulse-clock-module input, and a pulse-clock-module output. The first pulse-clock-module input is coupled to the clock. The second pulse-clock-module input is coupled to the latch-module output. The delay module is configured to delay the clock pulse at the second latch-module input. The delay module has a delay module input and a delay module output. The delay module is coupled between the latch-module output and the second pulse-clock-module input or between the pulse-clock-module output and the second latch-module input. The delay module is configured to provide functionally $\overline{I_1 I_A}$ at the delay module output, where $I_1$ is a function of I and $I_A$ is a function of $I_{N0}$ and $B_0$, and where I is the delay module input, $B_0$ is a first input bit, and $I_{N0}$ is a first net input.

In an aspect of the disclosure, a pulse generator includes a latch module, a pulse clock module, and a delay module. The latch module is configured to store a first state or a second state. The latch module has a first latch-module input, a second latch-module input, and a latch-module output. The first latch-module input is coupled to a clock. The pulse clock module is configured to generate a clock pulse. The pulse clock module has a first pulse-clock-module input, a second pulse-clock-module input, and a pulse-clock-module output. The first pulse-clock-module input is coupled to the clock. The second pulse-clock-module input is coupled to the latch-module output. The delay module is configured to delay a signal in order to delay the clock pulse at the second latch-module input. The delay module has a delay module input and a delay module output. The delay module is coupled between the latch-module output and the second pulse-clock-module input or between the pulse-clock-module output and the second latch-module input. The delay module includes at least two delay paths configured to delay the clock pulse to the second latch-module input, and one or more logic gates configured to change a state of the delay module output after the signal has propagated through each of the at least two delay paths to the one or more logic gates. The state of the delay module output is a function of each of the at least two delay paths.

BRIEF DESCRIPTION OF THE DRAWINGS

FIG. 1A is a diagram illustrating a pulse latch.

FIG. 1B is a diagram illustrating a pulse generator.

FIG. 1C is a diagram illustrating a functional timing diagram of the pulse generator of FIG. 1B.

FIG. 2A is a diagram illustrating a first exemplary pulse generator.

FIG. 2B is a diagram illustrating a second exemplary pulse generator.

DETAILED DESCRIPTION

Figure 3:
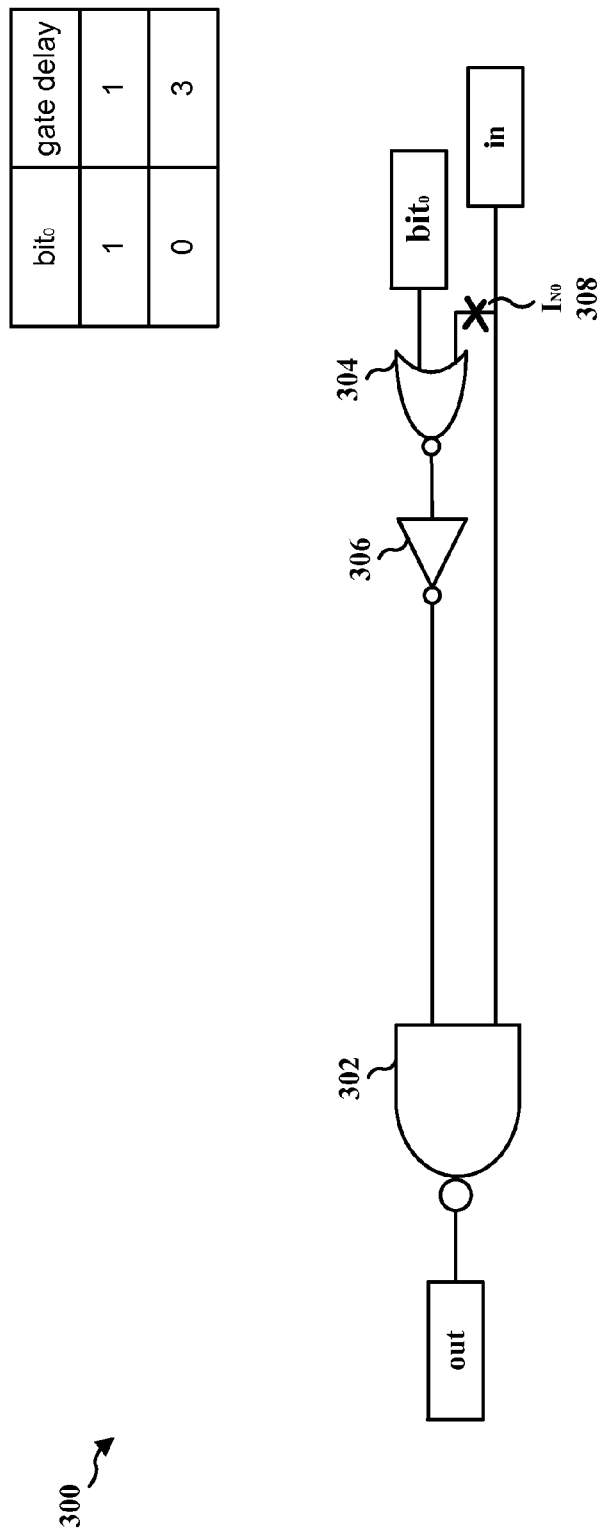
FIG. 3 is a diagram illustrating a first exemplary delay module.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As discussed supra, a pulse latch implements flip-flop functionality and includes a latch and a pulse generator for driving the latch. A pulse window generated by the pulse generator should be wide enough to provide a good write-margin for reliably writing into the latch. However, if the pulse window is too wide, the latch will need to have a large hold time. A large hold time of the latch requires additional hold logic within the latch, resulting in a latch that requires more area and consumes more power. Pulse latches should also have a sufficient hold-margin. The hold-margin is the minimum hold time of the pulse latch minus the requisite hold time (due to the width of the pulse window) of the pulse latch. If the hold-margin is insufficient, hold violations may occur in the pulse latch. In a digital signal processor (DSP), utilizing pulse latches may save 6% block level dynamic power compared to regular flop trays. In a modem, utilizing pulse latches may provide a 5% power benefit. To match pulse latch performance, a regular latch/flip-flop may need to be 1.5 times larger in area than a corresponding pulse latch. With the rapidly changing manufacturing process technologies (e.g., planar and fin field effect transistor (Fin- Fet) technologies), deterministic and bounded design of a pulsed latch is crucial for achieving an aggressive time-to-market.

Due to new process technologies and manufacturing variations, achieving both good hold-margin and write-margin (also referred to as writability) is difficult. Accordingly, achieving both good hold-margin and write-margin may result in a longer yield ramp-up time for volume system on a chip (SoC) production, and may impact time-to-market product delivery. A conservative design of the pulse latch (with excellent hold-margin and write-margin) may increase the area of the pulse latch and the power consumption. Without a sufficiently sized pulse width, the writability into the latch is not guaranteed across expected process, voltage, and temperature (PVT) variations. In order to provide a good write/hold margins, a pulse generator for a pulse latch is provided infra with a metal-programmable delay module for adjusting a pulse width of the pulse generator. Through an engineering change order (ECO) (to modify one or more metal layers in one or more masks) and/or input signals, the pulse generator may be configured to generate wider/narrower pulses.

FIG. 1A is a diagram illustrating a pulse latch 100. As shown in FIG. 1, a pulse latch 104 includes a latch 104 and a pulse generator 102 for driving the latch 104. The pulse generator 102 receives a clock (clk) input and outputs a pulse clock (pclk) to the latch 104. When the pulse clock (pclk) goes from high to low, the latch 104 is configured to output a latched state q, and to latch/store a new input state d. The pulse window of the pulse clock (pclk) should be sufficiently wide to allow for state d to be received as input during the pulse window. However, if the pulse window is too wide, the latch will need a large hold time for holding the state d until the pulse clock (pclk) goes low.

FIG. 1B is a diagram illustrating a pulse generator 120. The pulse generator 120 of FIG. 1B is the pulse generator 102 of FIG. 1A. The pulse generator 120 includes a set-reset (SR) latch 122, an AND gate 124, and a delay module 126. The SR latch 122 has an inverted set (S) input, a reset (R) input, and an output (Q). A clock (clk) is input to the inverted set (S) input and the AND gate 124. The output (Q) is also input to the AND gate 124. The AND gate 124 generates a pulse clock (pclk), which is input to the delay module 126. The delay module 126 may include one or more delay cells, such as buffers connected in series, or specifically, an even number of inverters connected in series. An output of the delay module 126 is connected to the reset (R) input.

FIG. 1C is a diagram illustrating a functional timing diagram 140 of the pulse generator 120 of FIG. 1B. As shown in FIG. 1C, before $t_0$, the clock (clk) is low, the set (S) input is high, and the output (Q) is high. As such, the pulse clock (pclk) is low and the reset (R) input is low. At $t_0$, the clock (clk) starts to go high, causing the set (S) input to go low. At $t_1$, the pulse clock (pclk) then starts to go high as the clock (clk) propagates through the AND gate 124. At $t_2$, the clock (clk) is high and the set (S) input is low. At $t_3$, the pulse clock (pclk) is also high. At $t_4$, the pulse clock (pclk) propagates through the delay module 126, causing the reset (R) input to start to go high. At $t_5$, the reset (R) input causes the output (Q) to start to go low. At $t_6$, the reset (R) input is high and, as a result of the output (Q) going low, the pulse clock (pclk) starts to go low. At $t_7$, the output (Q) is low. At $t_8$, the pulse clock (pclk) is low. At $t_9$, the pulse clock (pclk) propagates through the delay module 126, causing the reset (R) input to start to go low. At $t_{10}$, the reset (R) input is low. At $t_{11}$, the clock (clk) starts to go low, causing the set (S) input to go high, and thereafter at $t_{12}$, the rising set (S) input causes the output (Q) to start to go high. At $t_{13}$, the states are the same as before $t_0$, with the clock (clk) low, the set (S) input high, the output (Q) high, the pulse clock (pclk) low, and the reset (R) input low. The pulse window 142 of the pulse clock (pclk) is shown between $t_3$ and $t_6$. The time between $t_1$ (rising edge of the pulse clock (pclk)) and $t_4$ (rising edge of the reset (R) input) determines a width of the pulse window 142. As such, by adjusting the delay through the delay module 126, a width of the pulse window 142 may be adjusted.

FIG. 2A is a diagram illustrating a first exemplary pulse generator 200. The first exemplary pulse generator 200 includes an SR latch 202 with an inverted set (S) input, a reset (R) input, and an output (Q). A clock (clk) is input to the inverted set (S) input of the SR latch 202 and to an AND gate 204. The output (Q) is also input to the AND gate 204. An output of the AND gate 204 is a pulse clock (pclk). The pulse clock (pclk) is input to a delay module 206, which includes a set of delay elements/cells 208 and 210 connected in series. The delay element 208 is functionally an inverter, and may be the delay element shown infra with respect to FIG. 3 or FIG. 4. The delay element 210 is an inverter. An output of the inverter 210 is connected to the reset (R) input. The pulse clock (pclk) may be used to drive a latch in a pulse latch configuration.

FIG. 2B is a diagram illustrating a second exemplary pulse generator 250. The second exemplary pulse generator 250 includes an SR latch 252 with an inverted set (S) input, a reset (R) input, and an inverted output (Q). A clock (clk) is input to the inverted set (S) input of the SR latch 252 and to an AND gate 254. The output (Q) is input to a delay element 256. An output of the delay element is also input to the AND gate 204. An output of the AND gate 204 is a pulse clock (pclk). The pulse clock (pclk) is input to the reset (R) input. The delay element 256 is functionally an inverter, and may be the delay element shown infra with respect to FIG. 3 or FIG. 4. The pulse clock (pclk) may be used to drive a latch in a pulse latch configuration.

FIG. 3 is a diagram illustrating a first exemplary delay module 300. The delay module 300 includes a two-input NAND gate 302 with two inputs and an output out. A first input receives input in, which is coupled to the pulse clock (pclk). A second input receives input $in+bit_0$ through a NOR gate 304 and an inverter 306 (the symbol "+" is an OR operation, and is the same as V). The NOR gate 304 has inputs $I_{N0}$ and $bit_0$. The net input $I_{N0}$ (also referred to as branch net) of the NOR gate 304 is connected to input in. An output of the NOR gate 304 is connected to an input of the inverter 306. An output of the inverter 306 is connected to the second input of the NAND gate 302.

The delay module 300 delays a rising input in at the output out based on whether input $bit_0$ is set high or low. The delay between falling input in and the output out does not vary based on input $bit_0$. Assuming each gate 302, 304, 306 has a delay of $d_G$, for falling input in, the propagation delay is approximately $d_G$ (through gate 302). For rising input in, the propagation delay is approximately $d_G$ when input $bit_0$ is set to high (1), and is $3d_G$ when input $bit_0$ is set to low (0).

By default, the input $bit_0$ may be set to low (0) to provide a better write-margin for the pulse latch. However, if there are hold violations with the wider pulse width, the input $bit_0$ may be set to high (1) in order to narrow the pulse width and to provide a better hold-margin and fewer hold violations. Once sufficient write/hold margins are established with a particular configuration for the input $bit_0$, the configuration of the input $bit_0$ may be fixed so that the delay module 300 provides a delay of approximately $d_G$ or $3d_G$ for rising input in during a functional mode. The additional delay net for input $bit_0$ increases the clock power of the delay module 300. When only a delay of approximately $d_G$ is needed for rising input in, to save clock power, the net input $I_{N0}$ 308 may be disconnected from input in, and both inputs $I_{N0}$, $bit_0$ to the NOR gate 304 may be tied to high (1) through an ECO. The ECO allows for a mask change with one or more metal layers in association with the metal interconnects for the net input $I_{N0}$ and the input $bit_0$ connected to the inputs of the NOR gate 304. Thereafter, with the updated mask, an SoC may be fabricated without a connection of the net input $I_{N0}$ to the input in.

Figure 4:
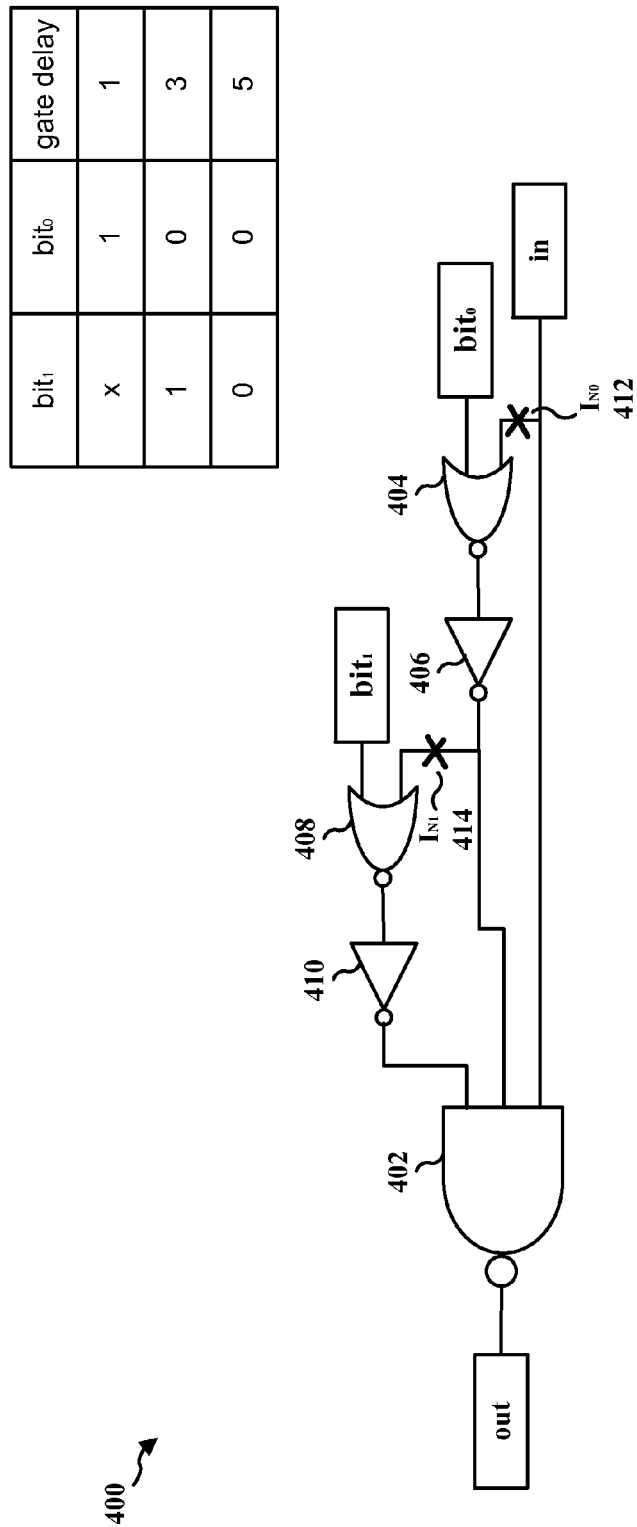
FIG. 4 is a diagram illustrating a second exemplary delay module.

FIG. 4 is a diagram illustrating a second exemplary delay module 400. The delay module 400 includes a three-input NAND gate 402 with three inputs and an output out. A first input receives input in, which is coupled to the pulse clock (pclk). A second input receives input in+$bit_0$ through a NOR gate 404 and an inverter 406. The NOR gate 404 has inputs $I_{N0}$ and $bit_0$. The net input $I_{N0}$ of the NOR gate 404 is connected to input in. An output of the NOR gate 404 is connected to the inverter 406. An output of the inverter 406 is connected to the second input of the NAND gate 402. A third input receives input in+$bit_0$+$bit_1$ through a NOR gate 408 and an inverter 410. The NOR gate 408 has inputs $I_{N1}$ and $bit_1$. The net input $I_{N1}$ of the NOR gate 408 is connected to input in+$bit_0$. An output of the NOR gate 408 is connected to an input of the inverter 410. An output of the inverter 410 is connected to the third input of the NAND gate 402.

The delay module 400 delays a rising input in at the output out based on whether input $bit_0$ and input $bit_1$ are set high or low. The delay between falling input in and the output out does not vary based on input $bit_0$ and input $bit_1$. Assuming each gate 402, 404, 406, 408, 410 has a delay of $d_G$, for falling input in, the propagation delay is approximately $d_G$ (through gate 402). For rising input in, the propagation delay is approximately $d_G$ when input $bit_0$ is set to high (1) (when input $bit_0$ is set to high (1), it does not matter how input $bit_1$ is set); $3d_G$ when input $bit_0$ is set to low (0) and input $bit_1$ is set to high (1); and $5d_G$ when both input $bit_0$ and input $bit_1$ are set to low (0).

By default, the input $bit_0$ may be set to low (0) and the input $bit_1$ may be set to high (1) to provide baseline write/hold margins for the pulse latch. If there are writability issues with the pulse latch in the default setting, the pulse width may be widened by setting the input $bit_1$ to low (0). The wider pulse width increases the write-margin and may allow the pulse latch to function with fewer writability errors. If there are hold violation issues with the pulse latch in the default setting, the pulse width may be narrowed by setting the input $bit_0$ to high (1). The narrower pulse width increases the hold-margin and may allow the pulse latch to function with fewer hold violations. Once sufficient write/hold margins are established (so that there are no writability errors and hold violations) with a particular configuration for the input $bit_0$ and the input $bit_1$, the configuration of the input $bit_0$ and the input $bit_1$ may be fixed so that the delay module 400 provides a delay of approximately $d_G$, $3d_G$, or $5d_G$ for rising input in during a functional mode. The additional delay nets for input $bit_0$ and input $bit_1$ increases the clock power of the delay module 400. When only a delay of approximately $d_G$ or $3d_G$ are needed for rising input in, to save clock power, the net input $I_{N1}$ 414 may be disconnected from input in+$bit_0$, and both inputs $I_{N1}$, $bit_1$ to the NOR gate 408 may be tied to high (1) through an ECO. In such a configuration, if a delay of approximately $d_G$ is needed, $bit_0$ may be set to high (1), and if a delay of approximately $3d_G$ is needed, $bit_0$ may be set to low (0). However, when only a delay of approximately $d_G$ is needed for rising input in, to save clock power (e.g., 3%), through an ECO, the net input $I_{N0}$ 412 may be disconnected from input in, and the inputs $I_{N0}$, $bit_0$, and $bit_1$ may be tied to high (1). As discussed supra, the ECO allows for a mask change with one or more metal layers in association with the metal interconnects for the net input $I_{N0}$, the net input $I_{N1}$, the input $bit_0$, and the input $bit_1$. Thereafter, with the updated mask, an SoC may be fabricated without a connection of the net input $I_{N0}$ to the input in and/or the net input $I_{N1}$ to the input in+$bit_0$.

Referring again to FIGS. 2A, 2B, 3, and 4, a pulse generator 200/250 includes a latch module 202/252, a pulse clock module 204/254, and a delay module 206/256. The latch module 202/252 is configured to store a first state (e.g., low (0)) or a second state (e.g., high (1)). The latch module 202/252 has a first latch-module input S, a second latch-module input R, and a latch-module output Q. The first latch-module input S is coupled to a clock clk. The pulse clock module 204/254 is configured to generate a clock pulse pclk. The pulse clock module has a first pulse-clock-module input, a second pulse-clock-module input, and a pulse-clock-module output. The first pulse-clock-module input is coupled to the clock clk. The second pulse-clock-module input is coupled to the latch-module output Q. For example, for the pulse generator 200, the second pulse-clock-module input is connected directly to the latch-module output Q. For another example, for the pulse generator 250, the second pulse-clock-module input is connected indirectly to the latch-module output Q through the delay module 256. The delay module 206/256 is configured to delay the clock pulse at the second latch-module input R. The delay module 206/256 has a delay module input and a delay module output. The delay module 206/256 is coupled between the latch-module output Q and the second pulse-clock-module input (see FIG. 2B) or between the pulse-clock-module output and the second latch-module input R (see FIG. 2A). The delay module 206/256 is configured to provide functionally $\overline{I_1 I_A}$ at the delay module output, where $I_1$ is a function of I and $I_A$ is a function of $I_{N0}$ and $B_0$ (e.g., $bit_0$), and where I is the delay module input in, $B_0$ is a first input bit, and $I_{N0}$ 308/412 is a first net input. The function $\overline{I_1 I_A}$ is the inversion of the result of a logical AND between $I_1$ and $I_A$ (the AND operation is the same as Λ). As such, $\overline{I_1 I_A}$ is the same as $\overline{I_1 \Lambda I_A}$. Generally, AB is logically the same as $\overline{\overline{A}+\overline{B}}$, and A+B is the same as $\overline{\overline{A}\overline{B}}$ (the symbol "+" is an OR operation, and is the same as V). As such, $\overline{I_1 I_A}$ is the same as $\overline{I}_1+\overline{I}_A$.

Referring to FIG. 4, in one configuration, $I_A=I_2 I_3$, the delay module 206/256 through the NAND gate 402 is configured to provide functionally $\overline{I_1 I_2 I_3}$ at the delay module output, where $I_1=I$ (e.g., $I_1$ is the input in), $I_2=I_{N0}+B_0$ (where $B_0$ is $bit_0$), and $I_3=I_{N1}+B_1$ (where $B_1$ is $bit_1$). Here, $B_0$ is a first input bit, $I_{N0}$ 412 is a first net input, $B_1$ is a second input bit, and $I_{N1}$ 414 is a second net input. As shown in FIG. 4, the first net input $I_{N0}$ 412 is functionally I (in) and the second net input $I_{N1}$ is functionally I+$B_0$. In addition, the delay module 206/256 is configured to provide functionally $I_1=I$ with a delay $d_1$, functionally $I_2=I+B_0$ with a delay $d_2$, and functionally $I_3=I+B_0+B_1$ with a delay $d_3$, where the delay $d_2$ is greater than the delay $d_1$, and the delay $d_3$ is greater than the delay $d_2$. Specifically, ignoring metal interconnect delays, the delay $d_1$ is approximately equal to zero, the delay $d_2$ is approximately equal to a delay $2d_G$, and the delay $d_3$ is approximately equal to a delay $4d_G$, where the delay $d_G$ is an approximate delay through a logic gate, such as the logic gates 404, 406, 408, 410. The delay module is configured to provide the delay $d_G$ (through the NAND gate 402) when the first input bit $B_0$ is set to the second state (e.g., high (1)), to provide the delay $3d_G$ (through the NOR gate 404, the inverter 406, and the NAND gate 402) when the first input bit $B_0$ is set to the first state (e.g., low (0)) and the second input bit $B_1$ is set to the second state (e.g., high (1)), and to provide the delay $5d_G$ (through the NOR gate 404, the inverter 406, the NOR gate 408, the inverter 410, and the NAND gate 402) when the first input bit $B_0$ and the second input bit $B_1$ are set to the first state (e.g., low (0)).

As shown in FIG. 4, the first net input $I_{N0}$ may be functionally equal to I if the first net input $I_{N0}$ is maintained with a connection to the input in. Further, through an ECO, the second net input $I_{N1}$ may be disconnected from receiving the input in, and both the second net input $I_{N1}$ and the second input bit $B_1$ (bit$_1$) may be set to the second state (e.g., high (1)). In such a configuration, the delay module is configured to provide functionally $I_1$=I with a delay $d_1$, functionally $I_2$=I+$B_0$ with a delay $d_2$, and functionally $I_3$ equal to the second state with no delay, where the delay $d_2$ is greater than the delay $d_1$.

As shown in FIG. 4, through an ECO, first net input $I_{N0}$ may be disconnected from receiving the input in, and the first net input $I_{N0}$ and the first input bit $B_0$ may be set to the second state (e.g., high (1)). Further, the second net input $I_{N1}$ and the second bit control $B_1$ may be set to the second state (e.g., high (1)). In one example, the second net input $I_{N1}$ may be at the second state (e.g., high (1)) because the second net input $I_{N1}$ receives the input in+$B_0$. In another example, through an ECO, the second net input $I_{N1}$ is disconnected from input in+$B_0$ and is connected to the second state (e.g., high (1)). In such a configuration, the delay module is configured to provide functionally $I_1$=I with a delay $d_1$, functionally $I_2$ equal to the second state with no delay, and functionally $I_3$ equal to the second state with no delay.

In one configuration, the delay module includes a first set of gates (e.g., NAND gate 402) configured to combine the functional inputs $I_1$, $I_2$, and $I_3$. The first set of gates has a first input, a second input, and a third input. The first input is coupled to one of the latch-module output (see FIG. 2B) or the pulse-clock-module output (see FIG. 2A). The first input is configured to provide the functional input $I_1$. The delay module further includes a second set of gates (e.g., NOR gate 404 and inverter 406) configured to generate the functional input $I_2$. The second set of gates has an output coupled to the second input of the first set of gates. The second set of gates has an input coupled to the first input bit $B_0$ (bit$_0$). The delay module further includes a third set of gates (e.g., NOR gate 408 and inverter 410) configured to generate the functional input $I_3$. The third set of gates has an output coupled to the third input of the first set of gates. The third set of gates has an input coupled to the second input bit $B_1$ (bit$_1$). In one configuration, with both branch net $I_{N0}$ 412 and branch net $I_{N1}$ 414 connected, the third set of gates has an additional input $I_{N1}$ 414 coupled to the output of the second set of gates, and the second set of gates has an additional input $I_{N0}$ 412 coupled to the first input of the first set of gates. In one configuration, with branch net $I_{N0}$ 412 connected and branch net $I_{N1}$ 414 disconnected, the third set of gates has an additional input $I_{N1}$ 414 set to the second state (e.g., high (1)), the second input bit $B_1$ (bit$_1$) is set to the second state (e.g., high (1)), and the second set of gates has an additional input $I_{N0}$ 412 coupled to the first input of the first set of gates. In one configuration, with branch net $I_{N0}$ 412 disconnected (branch net $I_{N1}$ 414 may or may not be disconnected), the third set of gates has an additional input $I_{N1}$ 414 set to the second state (e.g., high (1)), the second input bit $B_1$ (bit$_1$) is set to the second state (e.g., high (1)), the second set of gates has an additional input $I_{N0}$ 412 set to the second state (e.g., high (1)), and the first input bit $B_0$ (bit$_0$) is set to the second state (e.g., high (1)).

As shown in FIG. 4, the first set of gates includes the NAND gate 402. The second set of gates includes an inverter 406 coupled between the second input of the first set of gates and a first node, and includes a NOR gate 404 having a NOR gate output coupled to the first node and NOR gate inputs coupled to the first input bit $B_0$ and the first net input $I_{N0}$ 412. The third set of gates includes an inverter 410 coupled between the third input of the first set of gates and a first node, and a NOR gate 408 having a NOR gate output coupled to the first node and NOR gate inputs coupled to the second input bit $B_1$ and the second net input $I_{N1}$ 414.

In one configuration, as shown in FIG. 2A, the latch-module output is coupled to the second pulse-clock-module input, the pulse-clock-module output is coupled to the delay module input, the delay module output is coupled to an input of an inverter 210, and an output of the inverter 210 is coupled to the second latch-module input. In one configuration, as shown in FIG. 2B, the latch-module output is coupled to the delay module input, the delay module output is coupled to the second pulse-clock-module input, and the pulse-clock-module output is coupled to the second latch-module input. In such a configuration, the latch-module output Q is inverted. As shown in both FIGS. 2A, 2B, the latch module is an SR latch, the first latch-module input S is an inverted set (S) input of the SR latch, and the second latch-module input R is a reset (R) input of the SR latch.

Referring again to FIGS. 2A, 2B, 3, and 4, a pulse generator 200/250 includes a latch module 202/252, a pulse clock module 204/254, and a delay module 206/256. The latch module 202/252 is configured to store a first state (e.g., low (0)) or a second state (e.g., high (1)). The latch module 202/252 has a first latch-module input S, a second latch-module input R, and a latch-module output Q. The first latch-module input S is coupled to a clock clk. The pulse clock module is configured to generate a clock pulse pclk. The pulse clock module has a first pulse-clock-module input, a second pulse-clock-module input, and a pulse-clock-module output. The first pulse-clock-module input is coupled to the clock clk. The second pulse-clock-module input is coupled to the latch-module output Q. For example, for the pulse generator 200, the second pulse-clock-module input is connected directly to the latch-module output Q. For another example, for the pulse generator 250, the second pulse-clock-module input is connected indirectly to the latch-module output Q through the delay module 256. The delay module 206/256 is configured to delay a signal in order to delay the clock pulse pclk at the second latch-module input R. The delay module has a delay module input and a delay module output. The delay module is coupled between the latch-module output and the second pulse-clock-module input (see FIG. 2B) or between the pulse-clock-module output and the second latch-module input (see FIG. 2A). The delay module includes at least two delay paths (see FIGS. 3, 4) configured to delay the clock pulse pclk to the second latch-module input R. The delay module further includes one or more logic gates (e.g., NAND gate 302/402) configured to change a state of the delay module output after the signal has propagated through each of the at least two delay paths to the one or more logic gates. The state of the delay module output is a function of each of the at least two delay paths.

The delay module 300 of FIG. 3 includes 10 transistors, which is less than the number of transistors used (14) when one or more multiplexers are used in the implementation.

Further, the delay module 400 of FIG. 4 includes 18 transistors, which is less than the number of transistors used (26) when one or more multiplexers are used in the implementation. As such, the delay modules 300, 400 are more area efficient that multiplexer implemented delay modules. The delay modules 300, 400 allow for adjustment of a delay by setting one or more bits. The delays may be adjusted to increase a pulse width to improve a write-margin or to decrease a pulse width to improve a hold-margin. Further, the delay modules 300, 400 allow for changes through ECO after determining an optimum delay setting. Thereafter, after the ECO, SoCs may be manufactured with the optimal delay setting. Delay modules are provided with one-bit control (FIG. 3) and two-bit control (FIG. 4). However, from the description supra, it would be clear to one of ordinary skill in the art that a delay module may have n-bit control with n+1 delay paths.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A pulse generator, comprising:
    a latch module configured to store a first state or a second state, the latch module having a first latch-module input, a second latch-module input, and a latch-module output, the first latch-module input being coupled to a clock;
    a pulse clock module configured to generate a clock pulse, the pulse clock module having a first pulse-clock-module input, a second pulse-clock-module input, and a pulse-clock-module output, the first pulse-clock-module input being coupled to the clock, the second pulse-clock-module input being coupled to the latch-module output; and
    a delay module configured to delay the clock pulse at the second latch-module input, the delay module having a delay module input and a delay module output, the delay module being coupled between the latch-module output and the second pulse-clock-module input or between the pulse-clock-module output and the second latch-module input, wherein the delay module is configured to provide functionally $\overline{I_1 I_4}$ at the delay module output, where $I_1$ is a function of $I$ and $I_4$ is a function of $I_{N0}$ and $B_0$, and where $I$ is the delay module input, $B_0$ is a first input bit, and $I_{N0}$ is a first net input, wherein the delay module includes a first set of gates comprising a NOR gate and an inverter, the NOR gate having NOR gate inputs coupled to the first input bit $B_0$ and the first net input $I_{N0}$, and a NOR gate output coupled to the inverter.

2. The pulse generator of claim 1, wherein $I_4 = I_2 I_3$, the delay module is configured to provide functionally $\overline{I_1 I_2 I_3}$ at the delay module output, where $I_1 = I$, $I_2 = I_{N0} + B_0$, and $I_3 = I_{N1} + B_1$, and where $B_1$ is a second input bit and $I_{N1}$ is a second net input.

3. The pulse generator of claim 2, wherein the first net input $I_{N0}$ is functionally $I$ and the second net input $I_{N1}$ is functionally $I + B_0$, and wherein the delay module is configured to provide functionally $I_1 = I$ with a delay $d_1$, functionally $I_2 = I + B_0$ with a delay $d_2$, and functionally $I_3 = I + B_0 + B_1$ with a delay $d_3$, where the delay $d_2$ is greater than the delay $d_1$, and the delay $d_3$ is greater than the delay $d_2$.

4. The pulse generator of claim 3, wherein the delay $d_1$ is approximately equal to zero, the delay $d_2$ is approximately equal to a delay $2d_G$, and the delay $d_3$ is approximately equal to a delay $4d_G$, and wherein the delay $d_G$ is an approximate delay through a logic gate.

5. The pulse generator of claim 4, wherein the delay module is configured to provide the delay $d_G$ when the first input bit $B_0$ is set to the second state, to provide the delay $3d_G$ when the first input bit $B_0$ is set to the first state and the second input bit $B_1$ is set to the second state, and to provide the delay $5d_G$ when the first input bit $B_0$ and the second input bit $B_1$ are set to the first state.

6. The pulse generator of claim 2, wherein:
    the first net input $I_{N0}$ is functionally equal to $I$;
    the second net input $I_{N1}$ and the second input bit $B_1$ are set to the second state; and
    the delay module is configured to provide functionally $I_1 = I$ with a delay $d_1$, functionally $I_2 = I + B_0$ with a delay $d_2$, and functionally $I_3$ equal to the second state with no delay, where the delay $d_2$ is greater than the delay $d_1$.

7. The pulse generator of claim 2, wherein:
    the first net input $I_{N0}$ and the first input bit $B_0$ are set to the second state;
    the second net input $I_{N1}$ and the second input bit $B_1$ are set to the second state; and
    the delay module is configured to provide functionally $I_1 = I$ with a delay $d_1$, functionally $I_2$ equal to the second state with no delay, and functionally $I_3$ equal to the second state with no delay.

8. The pulse generator of claim 2, wherein the delay module further comprises:
a second set of gates configured to combine the functional inputs $I_1$, $I_2$, and $I_3$, the second set of gates having a first input, a second input, and a third input, the first input being coupled to one of the latch-module output or the pulse-clock-module output, the first input being configured to provide the functional input $I_1$; and
a third set of gates configured to generate the functional input $I_3$, the third set of gates having an output coupled to the third input of the second set of gates, the third set of gates having an input coupled to the second input bit $B_1$;
wherein the first set of gates is configured to generate the functional input $I_2$, the first set of gates having an output coupled to the second input of the second set of gates, the first set of gates having an input coupled to the first input bit $B_0$.

9. The pulse generator of claim 8, wherein the third set of gates has an additional input coupled to the output of the first set of gates, and the first set of gates has an additional input coupled to the first input of the second set of gates.

10. The pulse generator of claim 8, wherein the third set of gates has an additional input set to the second state, the second input bit $B_1$ is set to the second state, and the first set of gates has an additional input coupled to the first input of the second set of gates.

11. The pulse generator of claim 8, wherein the third set of gates has an additional input set to the second state, the second input bit $B_1$ is set to the second state, the first set of gates has an additional input set to the second state, and the first input bit $B_0$ is set to the second state.

12. The pulse generator of claim 8, wherein the second set of gates comprises a NAND gate.

13. A pulse generator, comprising:
a latch module configured to store a first state or a second state, the latch module having a first latch-module input, a second latch-module input, and a latch-module output, the first latch-module input being coupled to a clock;
a pulse clock module configured to generate a clock pulse, the pulse clock module having a first pulse-clock-module input, a second pulse-clock-module input, and a pulse-clock-module output, the first pulse-clock-module input being coupled to the clock, the second pulse-clock-module input being coupled to the latch-module output; and
a delay module configured to delay the clock pulse at the second latch-module input, the delay module having a delay module input and a delay module output, the delay module being coupled between the latch-module output and the second pulse-clock-module input or between the pulse-clock-module output and the second latch-module input, wherein the delay module is configured to provide functionally $\overline{I_1 I_4}$ at the delay module output, where $I_1$ is a function of I and $I_4$ is a function of $I_{N0}$ and $B_0$, and where I is the delay module input, $B_0$ is a first input bit, and $I_{N0}$ is a first net input, wherein the delay module comprises:
a first set of gates configured to combine functional inputs $I_1$, $I_2$, and $I_3$, the first set of gates having a first input, a second input, and a third input, the first input being coupled to one of the latch-module output or the pulse-clock-module output, the first input being configured to provide the functional input $I_1$;
a second set of gates configured to generate the functional input $I_2$, the second set of gates having an output coupled to the second input of the first set of gates, the second set of gates having an input coupled to the first input bit $B_0$; and
a third set of gates configured to generate the functional input $I_3$, the third set of gates having an output coupled to the third input of the first set of gates, the third set of gates having an input coupled to a second input bit $B_1$, wherein the third set of gates comprise an inverter coupled between the third input of the first set of gates and a first node, and a NOR gate having a NOR gate output coupled to the first node and NOR gate inputs coupled to the second input bit $B_1$ and a second net input $I_{N1}$.

14. A pulse generator, comprising:
a latch module configured to store a first state or a second state, the latch module having a first latch-module input, a second latch-module input, and a latch-module output, the first latch-module input being coupled to a clock;
a pulse clock module configured to generate a clock pulse, the pulse clock module having a first pulse-clock-module input, a second pulse-clock-module input, and a pulse-clock-module output, the first pulse-clock-module input being coupled to the clock, the second pulse-clock-module input being coupled to the latch-module output; and
a delay module configured to delay the clock pulse at the second latch-module input, the delay module having a delay module input and a delay module output, the delay module being coupled between the latch-module output and the second pulse-clock-module input or between the pulse-clock-module output and the second latch-module input, wherein the delay module is configured to provide functionally $\overline{I_1 I_4}$ at the delay module output, where $I_1$ is a function of I and $I_4$ is a function of $I_{N0}$ and $B_0$, and where I is the delay module input, $B_0$ is a first input bit, and $I_{N0}$ is a first net input, wherein the delay module comprises:
a first set of gates configured to combine functional inputs $I_1$, $I_2$, and $I_3$, the first set of gates having a first input, a second input, and a third input, the first input being coupled to one of the latch-module output or the pulse-clock-module output, the first input being configured to provide the functional input $I_1$;
a second set of gates configured to generate the functional input $I_2$, the second set of gates having an output coupled to the second input of the first set of gates, the second set of gates having an input coupled to the first input bit $B_0$; and
a third set of gates configured to generate the functional input $I_3$, the third set of gates having an output coupled to the third input of the first set of gates, the third set of gates having an input coupled to a second input bit $B_1$, wherein the latch-module output is coupled to the second pulse-clock-module input, the pulse-clock-module output is coupled to the delay module input, the delay module output is coupled to an input of an inverter, and an output of the inverter is coupled to the second latch-module input.

15. The pulse generator of claim 8, wherein the latch-module output is coupled to the delay module input, the delay module output is coupled to the second pulse-clock-module input, and the pulse-clock-module output is coupled to the second latch-module input.

16. The pulse generator of claim 15, wherein the latch-module output is inverted.

17. The pulse generator of claim 1, wherein the latch module is a set-reset (SR) latch, the first latch-module input is an inverted set input of the SR latch, and the second latch-module input is a reset input of the SR latch.

18. A pulse generator, comprising:
- a latch module configured to store a first state or a second state, the latch module having a first latch-module input, a second latch-module input, and a latch-module output, the first latch-module input being coupled to a clock;
- a pulse clock module configured to generate a clock pulse, the pulse clock module having a first pulse-clock-module input, a second pulse-clock-module input, and a pulse-clock-module output, the first pulse-clock-module input being coupled to the clock, the second pulse-clock-module input being coupled to the latch-module output; and
- a delay module configured to delay a signal in order to delay the clock pulse at the second latch-module input, the delay module having a delay module input and a delay module output, the delay module being coupled between the latch-module output and the second pulse-clock-module input or between the pulse-clock-module output and the second latch-module input, wherein the delay module comprises:
  - at least two delay paths configured to delay the clock pulse to the second latch-module input; and
  - one or more logic gates configured to change a state of the delay module output after the signal has propagated through each of the at least two delay paths to the one or more logic gates, the state of the delay module output being a function of each of the at least two delay paths,
- wherein the latch module output is coupled to the second pulse clock module input, the pulse clock module output is coupled to the delay module input, the delay module output is coupled to an input of an inverter, and an output of the inverter is coupled to the second latch module input.

19. The pulse generator of claim 18, wherein a delay $d_1$ through a first delay path of the at least two delay paths is approximately equal to zero, and a delay $d_2$ through a second delay path of the at least two delay paths is approximately equal to a delay $2d_G$, and wherein the delay $d_G$ is an approximate delay through a logic gate.

20. The pulse generator of claim 18, wherein the delay module is configured to provide functionally $\overline{I_1 I_4}$ at the delay module output, where $I_1$ is provided through a first delay path of the at least two delay paths and $I_4$ is provided through one or more additional delay paths of the at least two delay paths, where $I_1$ is a function of I and $I_4$ is a function of $I_{N0}$ and $B_0$, and where I is the delay module input, $B_0$ is a first input bit, and $I_{N0}$ is a first net input.

21. The pulse generator of claim 20, wherein the at least two delay paths comprise three delay paths that are configured to delay the clock pulse to the second latch-module input.

22. The pulse generator of claim 21, wherein $I_4 = I_2 I_3$, the delay module is configured to provide functionally $\overline{I_1 I_2 I_3}$ at the delay module output, where $I_2$ is provided through a second delay path of the at least three delay paths and $I_3$ is provided through a third delay path of the at least three delay paths, where $I_1 = I$, $I_2 = I_{N0} + B_0$, and $I_3 = I_{N1} + B_1$, and where $B_1$ is a second input bit and $I_{N1}$ is a second net input.

23. The pulse generator of claim 21, wherein a delay $d_1$ through a first delay path of the at least three delay paths is approximately equal to zero, a delay $d_2$ through a second delay path of the at least three delay paths is approximately equal to a delay $2d_G$, and a delay $d_3$ through a third delay path of the at least three delay paths is approximately equal to a delay $4d_G$, and wherein the delay $d_G$ is an approximate delay through a logic gate.

24. The pulse generator of claim 21, wherein a first delay path of the at least three delay paths is a function of the clock pulse, a second delay path of the at least three delay paths is a function of a first net input $I_{N0}$ and a first input bit $B_0$, and a third delay path of the at least three delay paths is a function of a second net input $I_{N1}$ and a second input bit $B_1$.

25. The pulse generator of claim 24, wherein the first net input $I_{N0}$ is functionally I and the second net input $I_{N1}$ is functionally $I+B_0$, and wherein the delay module is configured to provide functionally $I_1=I$ with a delay $d_1$, functionally $I_2=I+B_0$ with a delay $d_2$, and functionally $I_3=I+B_0+B_1$ with a delay $d_3$, where the delay $d_2$ is greater than the delay $d_1$, and the delay $d_3$ is greater than the delay $d_2$.

26. The pulse generator of claim 24, wherein:
- the first net input $I_{N0}$ is functionally equal to I;
- the second net input $I_{N1}$ and the second input bit $B_1$ are set to the second state; and
- the delay module is configured to provide functionally $I_1=I$ with a delay $d_1$, functionally $I_2=I+B_0$ with a delay $d_2$, and functionally $I_3$ equal to the second state with no delay, where the delay $d_2$ is greater than the delay $d_1$.

27. The pulse generator of claim 24, wherein:
- the first net input $I_{N0}$ and the first input bit $B_0$ are set to the second state;
- the second net input $I_{N1}$ and the second input bit $B_1$ are set to the second state; and
- the delay module is configured to provide functionally $I_1=I$ with a delay $d_1$, functionally $I_2$ equal to the second state with no delay, and functionally $I_3$ equal to the second state with no delay.

28. The pulse generator of claim 18, wherein the latch-module output is coupled to the delay module input, the delay module output is coupled to the second pulse-clock-module input, and the pulse-clock-module output is coupled to the second latch-module input.

* * * * *